United States Patent
Kamiya

(10) Patent No.: US 11,777,306 B2
(45) Date of Patent: Oct. 3, 2023

(54) LOAD CONTROL DEVICE FOR CONTROLLING ENERGIZATION OF A LOAD USING A SEMICONDUCTOR SWITCH

(71) Applicant: Yazaki Corporation, Tokyo (JP)

(72) Inventor: Yukio Kamiya, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 17/700,665

(22) Filed: Mar. 22, 2022

(65) Prior Publication Data

US 2022/0311239 A1 Sep. 29, 2022

(30) Foreign Application Priority Data

Mar. 24, 2021 (JP) .................................. 2021-050051

(51) Int. Cl.
*H02H 7/20* (2006.01)
*H02H 1/00* (2006.01)

(52) U.S. Cl.
CPC ............ *H02H 7/20* (2013.01); *H02H 1/0007* (2013.01)

(58) Field of Classification Search
CPC .............. G01R 31/327; G01R 31/3277; H02H 1/0007; H02H 3/087; H02H 3/20; H02H 3/202; H02H 7/12; H02H 7/1203; H02H 7/18; H02H 7/20; H02M 1/32; H03K 17/00; H03K 17/08; H03K 17/687
See application file for complete search history.

(56) References Cited

U.S. PATENT DOCUMENTS

| 9,537,300 | B2* | 1/2017 | Nishimoto | ............... H02H 3/08 |
| 10,153,632 | B2* | 12/2018 | Wortberg | ............. G01R 31/007 |
| 10,418,988 | B2* | 9/2019 | Morimoto | ............ H03K 17/122 |
| 11,038,371 | B2 | 6/2021 | Wakazono et al. | |
| 2017/0279443 | A1 | 9/2017 | Morimoto | |
| 2018/0323776 | A1 | 11/2018 | Bange et al. | |
| 2019/0356161 | A1 | 11/2019 | Wakazono et al. | |

FOREIGN PATENT DOCUMENTS

| DE | 102018212351 A1 | 1/2020 | |
| EP | 3754347 A1 | 12/2020 | |
| JP | H11-127065 A | 5/1999 | |
| JP | 2012-075262 A | 4/2012 | |
| JP | 2013-236297 A | 11/2013 | |
| JP | 2017183764 A * | 10/2017 | ............... H02H 5/00 |
| JP | 2018-133891 A | 8/2018 | |

\* cited by examiner

*Primary Examiner* — Jared Fureman
*Assistant Examiner* — Nicolas Bellido
(74) *Attorney, Agent, or Firm* — Banner & Witcoff, Ltd.

(57) ABSTRACT

A load control device includes an energization circuit unit connected between a power source and a load and configured to switch ON and OFF of energization of the load, a failure detection unit connected to a downstream side of the energization circuit unit, a current interruption unit connected to an upstream side of the energization circuit unit and configured to interrupt supply of current of the power source to the energization circuit unit based on an input from the failure detection unit, and a control unit configured to supply an ON-OFF control signal to the energization circuit unit. The energization circuit unit includes a first semiconductor switch and a second semiconductor switch which are connected in parallel to each other. The control unit supplies a common ON-OFF control signal to the first semiconductor switch and the second semiconductor switch.

4 Claims, 4 Drawing Sheets

LOAD CONTROL DEVICE FOR CONTROLLING ENERGIZATION OF A LOAD USING A SEMICONDUCTOR SWITCH

CROSS-REFERENCE TO RELATED APPLICATIONS

This application is based on and claims priority under 35 USC 119 from Japanese Patent Application No. 2021-050051 filed on Mar. 24, 2021, the contents of which are incorporated herein by reference.

TECHNICAL FIELD

The present invention relates to a load control device, and more particularly, to a load control device that controls energization of a load using a semiconductor switch.

BACKGROUND ART

For example, when power is supplied from a power source such as a battery to loads such as various electrical components on a vehicle, ON and OFF of power supply from the power source to the loads may be controlled using a semiconductor switch.

In the load control device as described above, there is a concern that a half-on failure may occur. In the half-on failure, the semiconductor switch is in a conductive state (ON state) while having a certain resistance value inside the semiconductor switch and the state is not switched as it is. When the half-on failure occurs, a large amount of heat may be generated by the resistance inside the failed semiconductor switch due to an influence of a large current that continues to flow through the load.

Further, a power supply control device described in JP-A-2018-133891 shows a technique for detecting a half-on failure even when a power source is connected to both ends of a semiconductor switch. Specifically, the power supply control device includes a plurality of semiconductor switches connected in parallel between two power sources, and controls power supply to loads connected to the two power sources via the plurality of semiconductor switches. The power supply control device further includes a temperature detection unit that detects a rise of temperature due to heat that is produced from at least one of the plurality of semiconductor switches, and a switching control unit that executes control to switch the plurality of semiconductor switches from OFF to ON if the temperature detection unit detects a temperature equal to or higher than a threshold temperature.

As shown in JP-A-2018-133891, in a case where the temperature detection unit is disposed outside the semiconductor switch, an influence of heat generation by the failed semiconductor switch can be detected when a half-on failure occurs, and thus the half-on failure can be detected.

However, since the temperature is detected outside the semiconductor switch, it is expected that a delay of the time from occurrence of the half-on failure inside the semiconductor switch to actual detection of the half-on failure is large due to a delay of heat propagation.

In general, in a semiconductor, a hot spot is generated due to variations in a resistance distribution inside an element. That is, a current may flow intensively only in a part of the inside of the element, and the heat generation is concentrated in the hat spot. Therefore, a temperature rise at the hot spot is steep, and when failure detection is delayed due to the delay of the heat propagation in a case of the occurrence of the half-on failure, there is a high possibility that a failed circuit cannot be interrupted before the hotspot overheats.

For example, when a host ECU (electronic control unit) that controls a load control device including a semiconductor switch is in a stopped state or in an intermittent operation state, the semiconductor switch is controlled OFF for a predetermined time, and thus it is expected that a time until a failure such as heating is detected is long. At this time, when a half-on failure occurs in the semiconductor switch, a large current continues to flow even though the semiconductor switch is in an OFF control state that should be safe, and a scene in which a problem of overheating occurs is expected.

SUMMARY OF INVENTION

The present invention has been made in view of the above circumstances, and an object of the present invention is to provide a load control device capable of easily preventing overheating even when a half-on failure occurs in a semiconductor switch.

Aspect of non-limiting embodiments of the present disclosure relates to provide a load control device including:

an energization circuit unit connected between a power source and a load and configured to switch ON and OFF of energization of the load;

a failure detection unit connected to a downstream side of the energization circuit unit;

a current interruption unit connected to an upstream side of the energization circuit unit and configured to interrupt supply of current of the power source to the energization circuit unit in a case that the failure detection unit detects a failure; and a control unit configured to supply an ON-OFF control signal to the energization circuit unit, in which the energization circuit unit includes a parallel switch circuit including a first semiconductor switch and a second semiconductor switch each having a current capacity being capable of controlling ON and OFF of energization of the load, the first semiconductor switch and the second semiconductor switch being connected in parallel to each other; and the control unit supplies a common ON-OFF control signal to the first semiconductor switch and the second semiconductor switch.

According to the load control device of the present invention, even when a half-on failure occurs in the semiconductor switch, it is easy to prevent the overheating. That is, the first semiconductor switch and the second semiconductor switch included in the parallel switch circuit perform the same operation based on the common ON-OFF control signal. Therefore, when one of the semiconductor switches has a half-on failure, a current is concentrated on the other normal semiconductor switch having a small on-resistance, and a temperature rise due to heat generation of the semiconductor switch having the half-on failure can be prevented. When the common ON-OFF control signal is OFF, the current is concentrated on the semiconductor switch having the half-on failure and the heat generation is expected, However, since the failure detection unit detects a failure and the current interruption unit interrupts supply of a current of the power source to the energization circuit unit, the heat generation can be avoided.

The present invention has been briefly described above. Further, details of the present invention will be clarified by reading an aspect (hereinafter, referred to as an "embodi-

DESCRIPTION OF EMBODIMENTS

Specific embodiments according to the present invention will be described below with reference to the accompanying drawings.

First Embodiment

Figure 1:
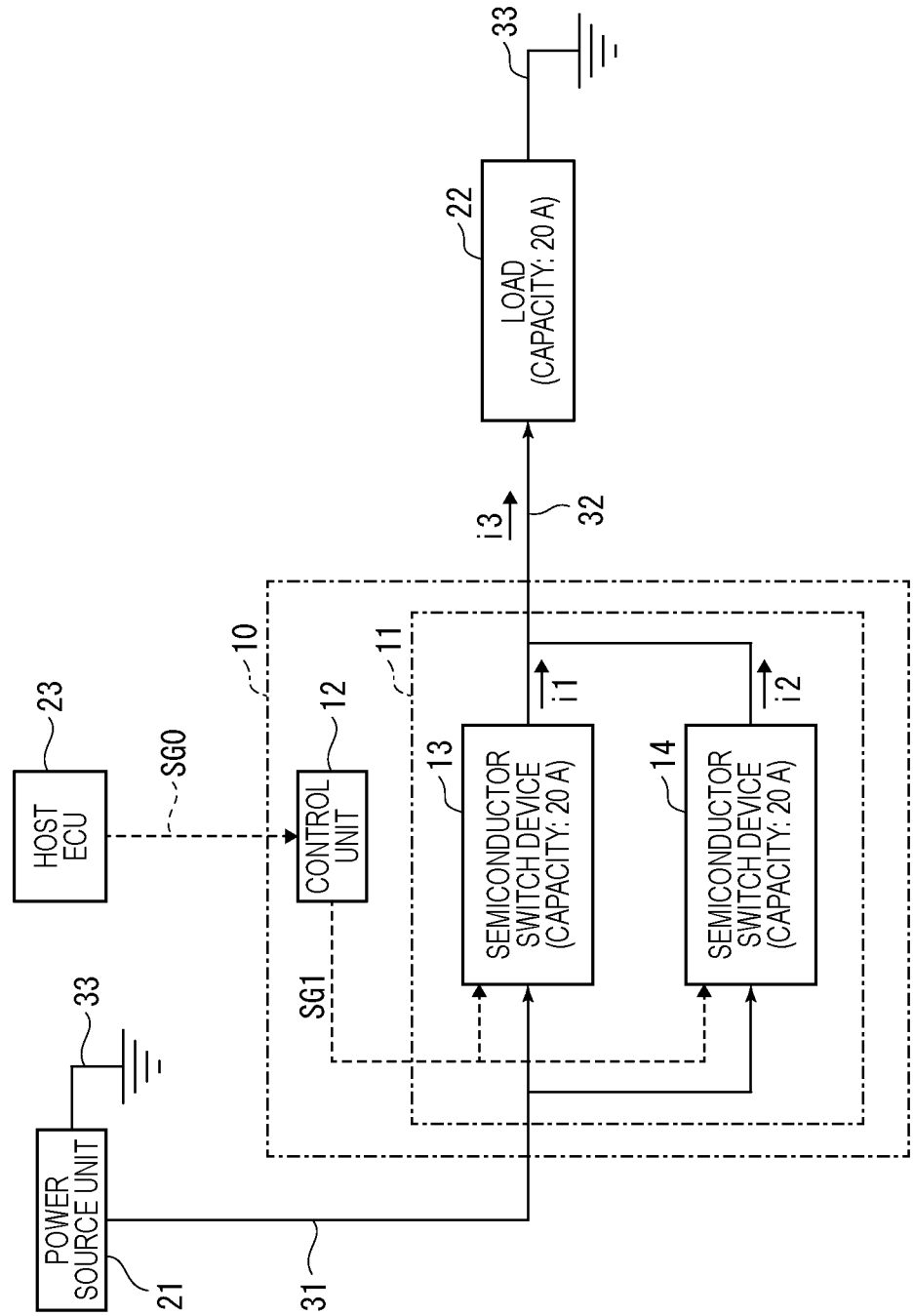
FIG. 1 is a block diagram showing a configuration example of a load control device according to a first embodiment of the present invention.

FIG. 1 is a block diagram showing a configuration example of a load control device 10 according to a first embodiment of the present invention.

The load control device 10 shown in FIG. 1 is used to perform ON-OFF control of energization when power output from a power source unit 21 is supplied to a load 22. Actually, the power source unit 21 corresponds to a power source such as an in-vehicle battery, and the load 22 corresponds to various electrical components mounted on a vehicle, for example, a lamp, a heater, an electric motor, an ECU, and the like.

In the example shown in FIG. 1, it is assumed that a current capacity of the load 22 connected to an output side of the load control device 10 is 20 [A].

A power source input side of the load control device 10 is connected to the power source unit 21 via a power line 31. The output side of the load control device 10 is connected to one end of the load 22 via a power line 32, and the other end of the load 22 is connected to a ground 33. The load control device 10 is connected to a host ECU 23 that outputs a control instruction signal SG0 for controlling ON and OFF of the load 22.

The load control device 10 includes an energization circuit unit 11 and a control unit 12. The control unit 12 generates an ON-OFF control signal SG1, which is a binary signal, in accordance with the control instruction signal SG0 from the host ECU 23, and applies the ON-OFF control signal SG1 to the energization circuit unit 11.

The energization circuit unit 11 has a function of a switch that switches presence or absence of conduction between the power line 31 and the power line 32 in accordance with the ON-OFF control signal SG1. In the example of FIG. 1, since the load 22 has a current capacity of 20 [A], a design specification is determined so that a current of 20 [A] can also flow through the energization circuit unit 11 in accordance with the current capacity.

As shown in FIG. 1, the energization circuit unit 11 is constituted as a parallel circuit of two semiconductor switch devices 13 and 14. That is, the energization circuit unit 11 can also allow a current from the power line 31 to flow to the power line 32 via a path of the semiconductor switch device 13, and can also allow a current from the power line 31 to flow to the power line 32 via a path of the semiconductor switch device 14.

The semiconductor switch device 13 has the current capacity of 20 [A]. Similarly, the semiconductor switch device 14 has the current capacity of 20 [A]. That is, each of the two semiconductor switch devices 13 and 14 is designed to be able to handle the current capacity of the load 22 independently.

As the two semiconductor switch devices 13 and 14, those having substantially the same characteristics such as on-resistance are adopted so as to be used as a pair. As a specific example of each of the semiconductor switch devices 13 and 14, for example, it is assumed that a field effect transistor (FET), a smart metal oxide semiconductor (MOS), an intelligent power device (IPD), or the like may be employed. It is assumed that an appropriate type of device is appropriately selected and adopted at the time of design in accordance with a magnitude of the current capacity of the load 22 to be connected, a type of the load, an operating environment, and the like.

As shown in FIG. 1, the common ON-OFF control signal SG1 is simultaneously applied to control input ports of the two semiconductor switch devices 13 and 14. Therefore, the two semiconductor switch devices 13 and 14 connected in parallel to each other operate in the same manner in a normal state. That is, the semiconductor switch device 14 is also turned on when the semiconductor switch device 13 is turned on (conductive state), and the semiconductor switch device 14 is also turned off when the semiconductor switch device 13 is turned off (non-conductive state).

In the example of FIG. 1, the energization circuit unit 11 is constituted as the parallel circuit of the two semiconductor switch devices 13 and 14, but the energization circuit unit 11 may be constituted as a circuit in which three or more same semiconductor switch devices are connected in parallel.

Operation of Load Control Device 10

The control unit 12 generates the ON-OFF control signal SG1 in accordance with the control instruction signal SG0 output from the host ECU 23. The ON-OFF control signal SG1 is simultaneously applied to the two semiconductor switch devices 13 and 14.

In a normal state, when the ON-OFF control signal SG1 is ON (for example, high potential), the two semiconductor switch devices 13 and 14 are simultaneously turned on (conductive state), and when the ON-OFF control signal SG1 is OFF (for example, low potential), the two semiconductor switch devices 13 and 14 are switched to OFF (non-conductive state).

Further, a resistance value (on-resistance: Ron) of the semiconductor switch devices 13 and 14 at the time of conduction is generally, for example, about 5 [mΩ]. Therefore, assuming that a current i3 flowing through the load 22 is 20 [A], for example, a current i1 or i2 of 20 [A] flows through any one of the semiconductor switch devices 13 and 14, power P1 consumed by one semiconductor switch device is calculated by the following equation.

$$P1 = 0.005 \times 20^2 = 2 \text{ [W]}$$

Due to heat generation caused by the power P1, a temperature rise ΔTj [deg] within a certain period of time in one semiconductor switch device is about 50 [° C.]. Therefore, if the temperature rise is prevented by using a heat sink, no particular problem occurs.

Since the energization circuit unit 11 of FIG. 1 includes the parallel circuit of the two semiconductor switch devices 13 and 14, an actual temperature rise ΔTj [deg] is prevented to about 14 [° C.]. That is, since the current (20 [A], which is the same as i3) of the power line 31 is divided into two systems to become currents i1 and i2, both the currents i1 and i2 are about 10 [A], and a heat generation amount is about ¼ as compared with a case of only a single semiconductor switch device.

On the other hand, when a half-on failure occurs, it is assumed that the resistance of the semiconductor switch device remains unchanged at about 70 [mΩ]. In the case of the failure, for example, assuming that the current i1 or i2 of 20 [A] flows through any one of the semiconductor switch devices 13 and 14, power P2 consumed by one semiconductor switch device is calculated by the following equation.

$$P2=0.070\times20^2=28 \text{ [W]}$$

Due to heat generation caused by the power P2, the temperature rise ΔTj [deg] within a certain period of time in one semiconductor switch device is about 600 [°°C.]. Therefore, even when the heat sink is used, a steep temperature rise may occur at a hot spot in the device.

However, in the energization circuit unit 11 of the load control device 10 shown in FIG. 1, since the two semiconductor switch devices 13 and 14 are connected as the parallel circuit, the above rapid temperature rise does not occur.

For example, assuming that the half-on failure occurs in one semiconductor switch device 13, a resistance value R1 of the semiconductor switch device 13 is 70 [mΩ], and the on-resistance Ron of the other normal semiconductor switch device 14 is 5.5 [mΩ], the following is obtained.

Temperature rise ΔTj1 of the semiconductor switch device 13: 3 [° C.]

Temperature rise ΔTj2 of the semiconductor switch device 14: 48 [° C.]

That is, in both the semiconductor switch device 13 having the half-on failure and the normal semiconductor switch device 14, temperature rises ΔTj1 and ΔTj2 are limited, and the overheating can be avoided.

Second Embodiment

Figure 2:
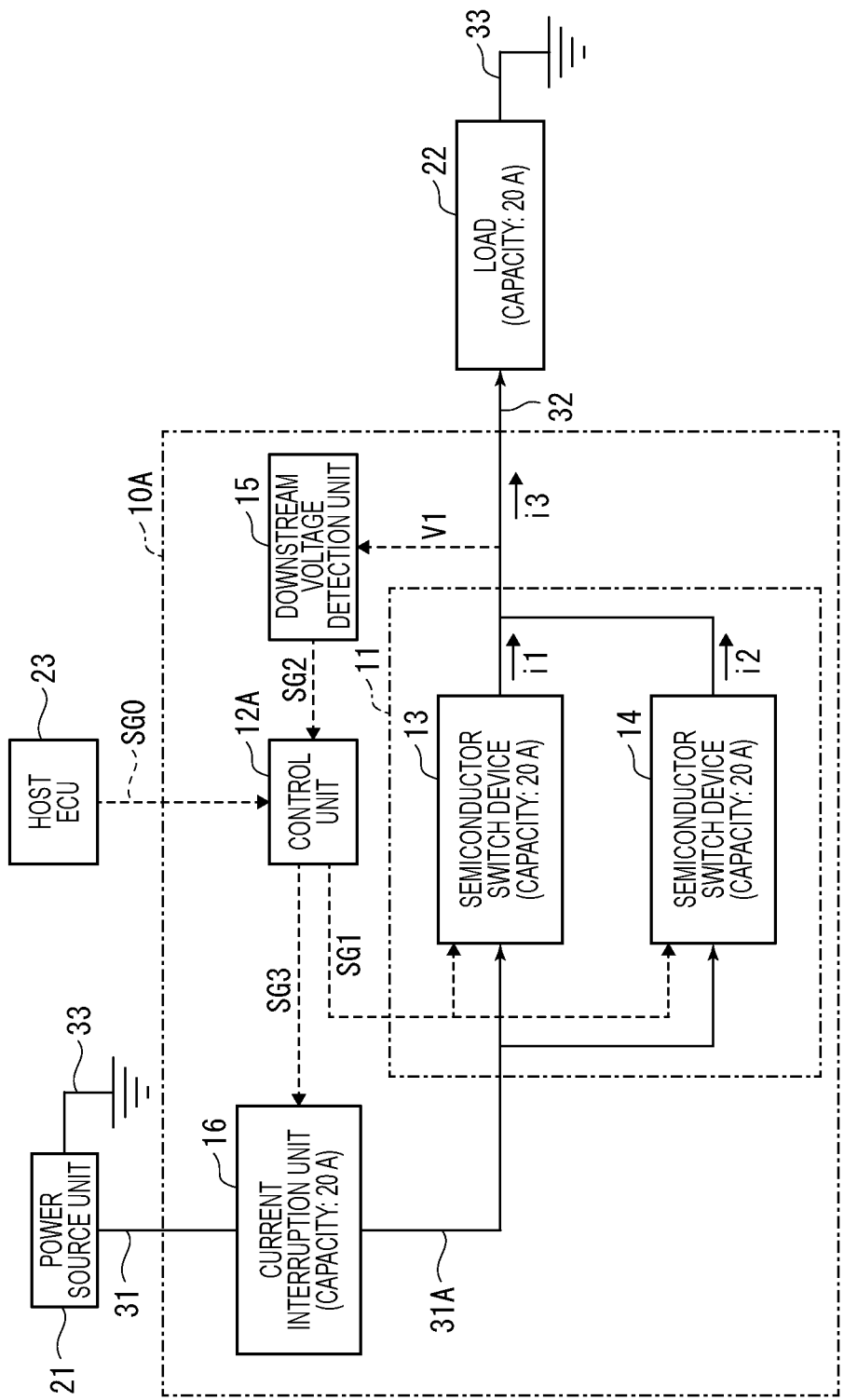
FIG. 2 is a block diagram showing a configuration example of a load control device according to a second embodiment of the present invention.

FIG. 2 is a block diagram showing a configuration example of a load control device 10A according to a second embodiment of the present invention. Similarly to the load control device 10 according to the first embodiment, the load control device 10A shown in FIG. 2 is used to perform the ON-OFF control of the energization when the power output from the power source unit 21 is supplied to the load 22. The load control device 10A is designed on the assumption that the current capacity of the load 22 connected to an output side of the load control device 10A is 20 [A].

Similarly to the load control device 10, the load control device 10A shown in FIG. 2 includes the energization circuit unit 11 and a control unit 12A. The load control device 10A further includes a downstream voltage detection unit 15 and a current interruption unit 16.

As in the first embodiment, a power source input side of the load control device 10A is connected to the power source unit 21 via the power line 31. An output side of the load control device 10A is connected to the load 22 via the power line 32. The load control device 10A is connected to the host ECU 23 that outputs the control instruction signal SG0 for controlling ON and OFF of the load 22.

A configuration of the energization circuit unit 11 in the load control device 10A is the same as that of the first embodiment. Further, the control unit 12A has a function for controlling the added downstream voltage detection unit 15 and current interruption unit 16.

The downstream voltage detection unit 15 detects a downstream voltage V1 used for abnormality detection of the energization circuit unit 11 on the power line 32, and transmits information on the detected downstream voltage V1 to the control unit 12A as a detection signal SG2.

The current interruption unit 16 includes one semiconductor switch device. Like the semiconductor switch devices 13 and 14 in the energization circuit unit 11, the current interruption unit 16 has a capability of allowing the current of 20 [A] in accordance with the current capacity of the load 22. The semiconductor switch device of the current interruption unit 16 is connected between power lines 31 and 31A, and is turned on or off in accordance with an interruption control signal SG3 applied to a control input.

That is, the current interruption unit 16 brings the power lines 31 and 31A into a conductive state in a steady state, but when the interruption control signal SG3 is ACTIVE (ON), the current interruption unit 16 switches to a non-conductive state to interrupt passage of a current. Since the current interruption unit 16 is connected to an upstream side of the energization circuit unit 11, the currents i1, i2, and i3 on the downstream side thereof are 0 when the current interruption unit 16 interrupts the current.

Operation of Load Control Device 10A

Figure 3:
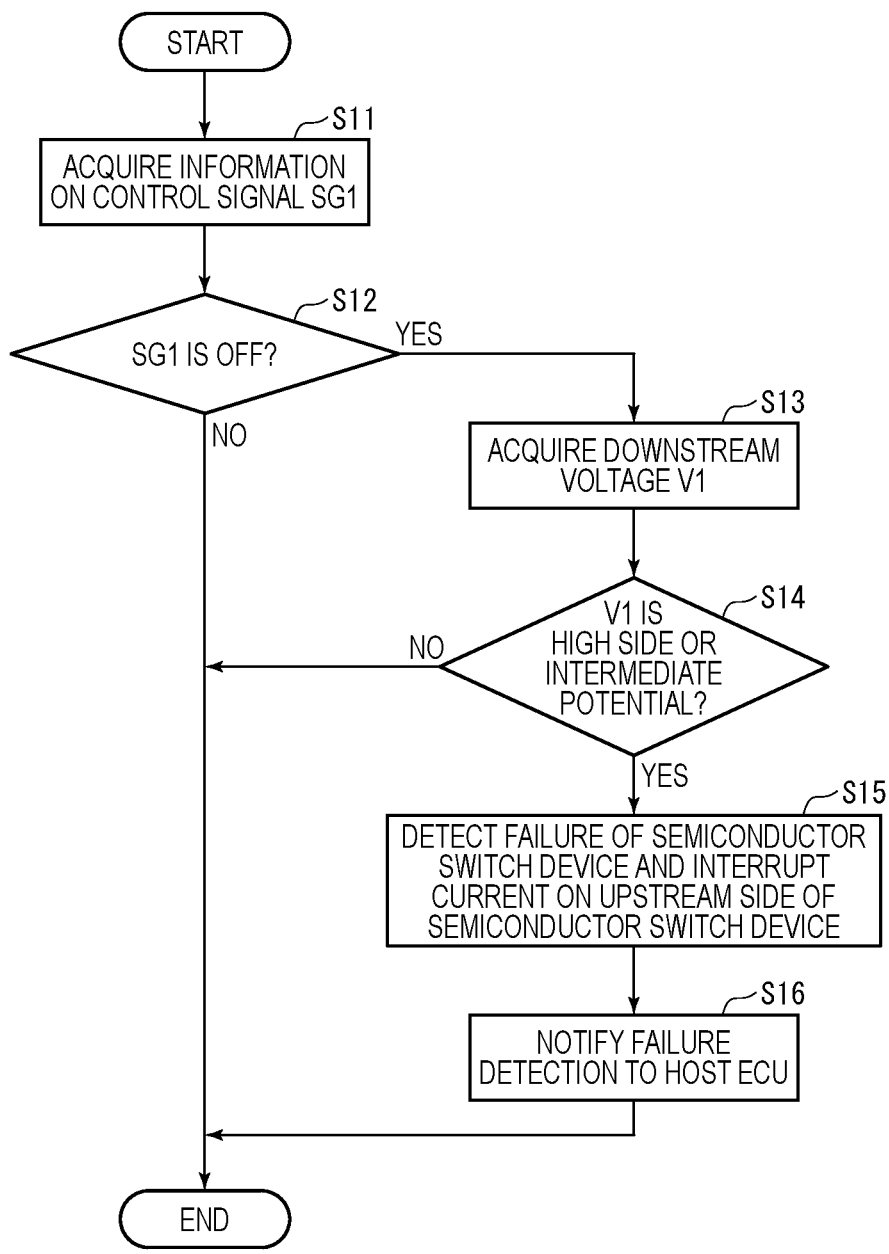
FIG. 3 is a flowchart showing an operation example of a control unit.

FIG. 3 is a flowchart showing an operation example of the control unit 12A. A basic operation of the energization circuit unit 11 of the load control device 10A is the same as that of the first embodiment, but the currents i1 and i2 change with the control of the control unit 12A and the current interruption unit 16.

An operation of the control unit 12A shown in FIG. 3 will be described below. The control unit 12A acquires information indicating a current ON-OFF state of the ON-OFF control signal SG1 in S11, and identifies the ON-OFF state (S12). When the ON-OFF control signal SG1 is OFF, the control unit 12A acquires information on the downstream voltage V1 detected by the downstream voltage detection unit 15 in S13.

The control unit 12A identifies whether an abnormality occurs by comparing the downstream voltage V1 with a predetermined threshold voltage (S14). That is, if the energization circuit unit 11 is normal, the downstream voltage V1 when the ON-OFF control signal SG1 is OFF is a low potential close to 0 [V]. However, when a failure occurs in any one of the semiconductor switch devices 13 and 14, the downstream voltage V1 is a high side potential close to a power source voltage or an intermediate potential slightly lower than the power source voltage.

For example, when the semiconductor switch device 13 or 14 fails in a completely ON state, a voltage drop of the energization circuit unit 11 corresponding to the resistance value (for example, about 5 [mΩ]) of the failed semiconductor switch device is 0.1 [V] with respect to the current of 20A, and thus the downstream voltage V1 that is substantially the same as the voltage of the power line 31A is detected.

When the semiconductor switch device 13 or 14 has a half-on failure, the voltage drop of the energization circuit unit 11 corresponding to the resistance value (for example, about 70 [mΩ]) of the failed semiconductor switch device is, for example, 1.4 [V] with respect to the current of 20A, and thus the downstream voltage V1 is detected as an intermediate potential lower by about IV than the voltage of the power line 31A.

In any case, when a failure occurs in the energization circuit unit 11, the control unit 12A proceeds from S14 to S15, and thus the control unit 12A detects the failure of the semiconductor switch device 13 or 14 in the energization circuit unit 11. Then, the control unit 12A switches the interruption control signal SG3 to ACTIVE in S15. Accordingly, the current interruption unit 16 interrupts the current of the power line 31A.

The control unit 12A notifies the host ECU 23 that a failure has occurred in the energization circuit unit 11 (S16).

Thus, since the load control device 10A according to the present embodiment performs the operation shown in FIG. 3, an abnormal temperature rise is avoided by current interruption of the current interruption unit 16. Since an abnormal change immediately appears in the downstream voltage V1 for the failure of the semiconductor switch devices 13 and 14 in the energization circuit unit 11, the control unit 12A can instantly detect the failure and interrupt the current. That is, since no time delay occurs, the overheating can be reliably prevented.

Although only the presence or absence of a failure of the semiconductor switch is detected in S14 of FIG. 3, it is also possible to distinguish between a half-on failure and other failures by comparing the downstream voltage V1 with a plurality of threshold values. The load control device 10A of FIG. 2 detects a failure based on the downstream voltage V1, but the load control device 10A may detect occurrence of a failure or abnormal heating based on a temperature change outside the semiconductor switch device in the same manner as in the related art as long as a temperature rise speed in the semiconductor switch devices 13 and 14 is expected to be relatively slow.

Figure 4:
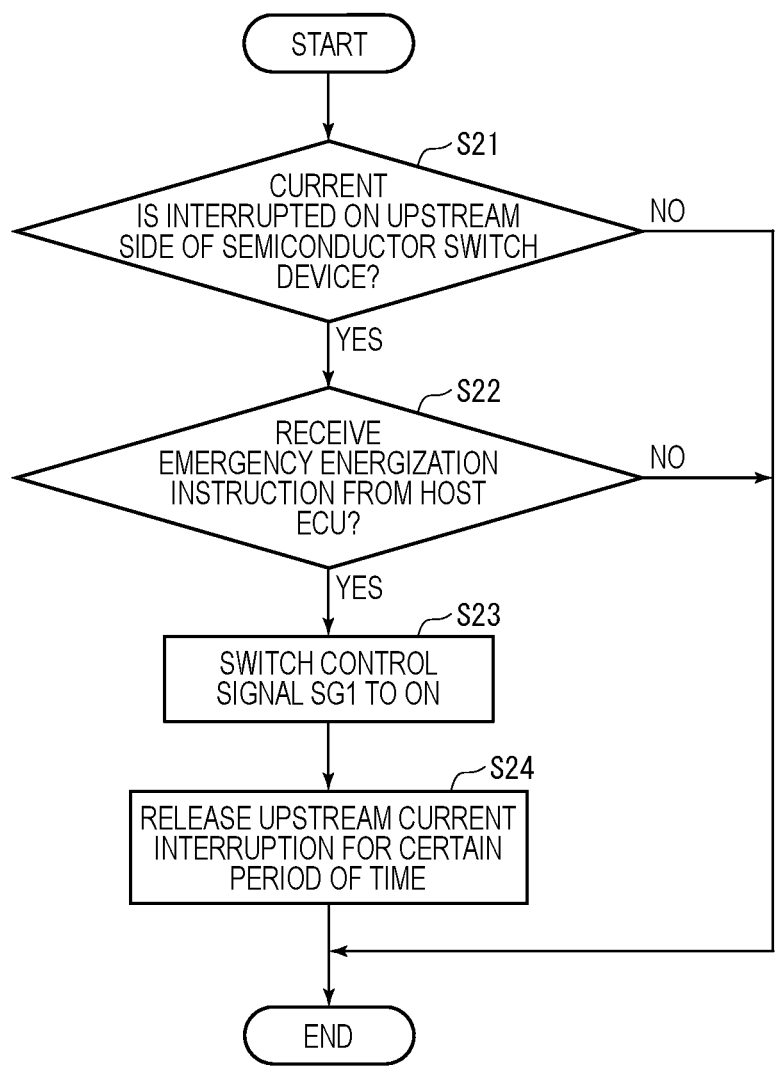
FIG. 4 is a flowchart showing an operation example of a temporary release mode.

FIG. 4 is a flowchart showing an operation example of a temporary release mode in the control unit 12A. In the load control device 10A shown in FIG. 2, when any one of the semiconductor switch devices 13 and 14 fails in the energization circuit unit 11, the current interruption unit 16 interrupts the current by the operation of FIG. 3, and thus the overheating can be reliably prevented. When the current interruption unit 16 interrupts the current at the time of failure, the load 22 cannot be used at all. However, for example, When it is necessary for an occupant to escape from the vehicle in an emergency, it is important to release a door lock, open a window with a power window, or output an alarm or a signal as a safety measure. That is, it is necessary to enable energization of the load 22 necessary for an emergency operation.

The operation shown in FIG. 4 represents control for temporarily enabling the load 22 to be used while preventing heat generation due to a failure even when the current interruption unit 16 interrupts the current due to the occurrence of the failure. The operation shown in FIG. 4 will be described below.

In S21, the control unit 12A identifies whether the current is interrupted by the current interruption unit 16 by activating the interruption control signal SG3. If the current is interrupted, it is identified whether an emergency energization instruction from the host ECU 23 is received (S22).

When the emergency energization instruction is received, the control unit 12A switches the ON-OFF control signal SG1 to ON in the next S23, and then temporarily releases the interruption control signal SG3 in the next S24 to permit energization of the current interruption unit 16. A length of a permitted time is, for example, a predetermined time determined in advance.

When the control unit 12A switches the ON-OFF control signal SG1 to ON, the currents i1 and i2 flow through both of the two semiconductor switch devices 13 and 14. Therefore, even when any one of the semiconductor switch devices 13 and 14 has a half-on failure, the current flowing to a failure location is reduced. Therefore, it is possible to operate the load 22 in a safe state without causing the overheating only by temporarily flowing a current to the failed semiconductor switch device 13 or 14.

All of the energization circuit unit 11, the control unit 12A, the downstream voltage detection unit 15, and the current interruption unit 16, which are main components of the load control device 10A shown in FIG. 2, may be incorporated as an ECU on a single circuit board, or may be divided and disposed on a plurality of independent ECUs. For example, the energization circuit unit 11, the control unit 12A, and the downstream voltage detection unit 15 may be constituted as one ECU, and the current interruption unit 16 may be disposed on another ECU.

As described above, according to the load control devices 10 and 10A of the present embodiment, since the plurality of semiconductor switch devices 13 and 14 connected in parallel are provided in the energization circuit unit 11, it is possible to prevent a large current from flowing through the failed semiconductor switch device when a half-on failure occurs in any one of the plurality of semiconductor switch devices 13 and 14. Therefore, the overheating can be prevented.

In the case of the load control device 10A, when a failure is detected on the downstream side, the current interruption unit 16 on the upstream side interrupts the current, and thus it is possible to prevent an abnormal current from flowing through the failed semiconductor switch device when the ON-OFF control signal SG1 is in an OFF state. Since the control unit 12A of the load control device 10A detects a failure based on the downstream voltage V1, the failure can be instantly detected, which is effective in preventing overheating. Here, features of the load control device according to the embodiments of the present invention described above will be briefly summarized and listed in the following [1] to [5].

[1] A load control device (10A) including:
an energization circuit unit (11) connected between a power source (power source unit 21) and a load (22) and configured to switch ON and OFF of energization of the load;
a failure detection unit (downstream voltage detection unit 15, control unit 12A, and S12 to S14) connected to a downstream side of the energization circuit unit;
a current interruption unit (16) connected to an upstream side of the energization circuit unit and configured to interrupt supply of current of the power source to the energization circuit unit in a case that the failure detection unit detects a failure; and
a control unit (12A) configured to supply an ON-OFF control signal to the energization circuit unit, in which
the energization circuit unit includes a parallel switch circuit including a first semiconductor switch (semiconductor switch device 13 or 14) and a second semiconductor switch (semiconductor switch device 14 or 13) each having a current capacity being capable of controlling ON and OFF of energization of the load, and the first semiconductor switch and the second semiconductor switch being connected in parallel to each other, and the control unit supplies a common ON-OFF control signal (SG1) to the first semiconductor switch and the second semiconductor switch.

[2] The load control device according to [1], in which the failure detection unit detects the failure based on a state of the ON-OFF control signal input to the energization circuit unit and a downstream voltage detected at a the downstream side of the energization circuit unit (S12 to S14),

[3] The load control device according to [2], in which the failure detection unit detects the failure when the ON-OFF control signal input to the energization circuit unit is in an OFF state and the downstream voltage is a predetermined high potential in a steady state or an intermediate potential close to the high potential (S12 to S14).

[4] The load control device according to any one of [1] to [3], in which
the first semiconductor switch and the second semiconductor switch have substantially the same impedance characteristics in the steady state.

[5] The load control device according to any one of [1] to [4], in which
the control unit (12A) has a temporary release mode (S21 to S24) of temporarily releasing interruption of the current interruption unit when a predetermined condition is satisfied after the current interruption unit interrupts the current in a case where the failure detection unit detects a specific failure.

According to the load control device having a configuration of [1], the first semiconductor switch and the second semiconductor switch included in the parallel switch circuit perform the same operation according to the common ON-OFF control signal. Therefore, when one of the semiconductor switches has a half-on failure, a current is concentrated on the other normal semiconductor switch having a small on-resistance, and a temperature rise due to heat generation of the semiconductor switch having the half-on failure can be prevented. When the common ON-OFF control signal is OFF, the current is concentrated on the semiconductor switch having the half-on failure and the heat generation is expected. However, since the failure detection unit detects a failure and the current interruption unit interrupts supply of a current of the power source to the energization circuit unit, the heat generation can be avoided.

According to the load control device having a configuration of [2], it is possible to detect the failure before the temperature rises due to the current flowing through the semiconductor switch having the half-on failure. That is, when a current flows through the semiconductor switch due to the half-on failure even though the semiconductor switch is controlled OFF, an influence of the current is immediately reflected on a voltage on the downstream side, and thus it is possible to instantly detect a failure without being affected by a heat propagation delay.

According to the load control device having a configuration of [3], it is possible to easily detect the half-on failure in the semiconductor switch. That is, when one of the semiconductor switches has the half-on failure, the voltage on the downstream side in a state where the ON-OFF control signal is OFF is determined according to a voltage division ratio between an uncertain on-resistance of a failed semiconductor switch and a resistance of the load, and thus the half-on failure can be detected by comparing the detected voltage on the downstream side with an appropriate threshold value.

According to the load control device having a configuration of [4], the impedance characteristics of two semiconductor switches in the steady state are equivalent. Therefore, when one of the semiconductor switches is in a half-on failure state and a resistance value increases, the current is reliably concentrated on the other normal semiconductor switch side, and the heat generation from the semiconductor switch having the half-on failure can be prevented.

According to the load control device having a configuration of [5], for example, by using the temporary release mode in an emergency, it is possible to temporarily use the load even when the half-on failure of the semiconductor switch occurs. Even in this case, if a normal semiconductor switch having no failure is effectively used, overheating of the semiconductor switch having the half-on failure can be prevented.

What is claimed is:

1. A load control device comprising:
an energization circuit unit connected between a power source and a load and configured to switch ON and OFF energization of the load;
a failure detection unit connected to a downstream side of the energization circuit unit;
a current interruption unit connected to an upstream side of the energization circuit unit and configured to interrupt supply of current of the power source to the energization circuit unit in a case that the failure detection unit detects a failure; and
a control unit configured to supply a common ON-OFF control signal to the energization circuit unit, wherein
the energization circuit unit includes a parallel switch circuit including a first semiconductor switch and a second semiconductor switch each having a current capacity being capable of controlling ON and OFF of energization of the load, and the first semiconductor switch and the second semiconductor switch being connected in parallel to each other,
the control unit supplies the common ON-OFF control signal to the first semiconductor switch and the second semiconductor switch, and
the control unit has a temporary release mode of temporarily releasing interruption of the current interruption unit when a predetermined condition is satisfied after the current interruption unit interrupts the current in a case where the failure detection unit detects a specific failure.

2. The load control device according to claim 1, wherein the failure detection unit detects the failure based on a state of the common ON-OFF control signal input to the energization circuit unit and a downstream voltage detected at the downstream side of the energization circuit unit.

3. The load control device according to claim 2, wherein the failure detection unit detects the failure when the common ON-OFF control signal input to the energization circuit unit is in an OFF state and the downstream voltage is a predetermined high potential in a steady state or an intermediate potential close to the predetermined high potential.

4. The load control device according to claim 3, wherein the first semiconductor switch and the second semiconductor switch have substantially the same impedance characteristics in the steady state.

* * * * *